United States Patent
Albin (10) Patent No.: US 12,195,879 B2
(45) Date of Patent: Jan. 14, 2025

(54) EXTREME LARGE GRAIN (1 MM) LATERAL GROWTH OF CD(SE,TE) ALLOY THIN FILMS BY REACTIVE ANNEALS

(71) Applicant: Alliance for Sustainable Energy, LLC, Golden, CO (US)

(72) Inventor: David Scott Albin, Denver, CO (US)

(73) Assignee: Alliance for Sustainable Energy, LLC, Golden, CO (US)

(*) Notice: Subject to any disclaimer, the term of this patent is extended or adjusted under 35 U.S.C. 154(b) by 0 days.

(21) Appl. No.: 17/630,292

(22) PCT Filed: Jul. 27, 2020

(86) PCT No.: PCT/US2020/043731
§ 371 (c)(1),
(2) Date: Jan. 26, 2022

(87) PCT Pub. No.: WO2021/021731
PCT Pub. Date: Feb. 4, 2021

(65) Prior Publication Data
US 2022/0290328 A1   Sep. 15, 2022

Related U.S. Application Data

(60) Provisional application No. 62/879,191, filed on Jul. 26, 2019.

(51) Int. Cl.
C30B 31/08 (2006.01)
C01B 19/00 (2006.01)
C30B 33/02 (2006.01)
H01L 31/0296 (2006.01)

(52) U.S. Cl.
CPC ............ *C30B 31/08* (2013.01); *C01B 19/007* (2013.01); *C30B 33/02* (2013.01); *H01L 31/0296* (2013.01); *C01P 2002/60* (2013.01); *C01P 2006/40* (2013.01)

(58) Field of Classification Search
CPC ....... C30B 31/08; C30B 33/02; C01B 19/007; H01L 31/0296; C01P 2002/60; C01P 2006/40
See application file for complete search history.

(56) References Cited

U.S. PATENT DOCUMENTS

| | | |
|---|---|---|
| 3,793,069 A | 2/1974 | Shimizu et al. |
| 2013/0217176 A1 | 8/2013 | Munteanu et al. |
| 2016/0126396 A1 | 5/2016 | Damjanovic et al. |

FOREIGN PATENT DOCUMENTS

| | | |
|---|---|---|
| EP | 2017/176463 | * 10/2017 |
| EP | 2017210280 | * 12/2017 |

OTHER PUBLICATIONS

Albin, D.S. et al., "Collossal grain growth in Cd(Se, Te) thin films and their subsequent use in CdTe epitaxy by close-spaced sublimation," Journal of Physics: Energy, vol. 3, 2021, 13 pages.
(Continued)

*Primary Examiner* — Robert M Kunemund
(74) *Attorney, Agent, or Firm* — Sam J. Barkley (57) ABSTRACT

Disclosed herein are compositions and methods for making polycrystalline thin films having very large grains sizes and exhibiting improved properties over existing thin films.

20 Claims, 4 Drawing Sheets

(56) References Cited

OTHER PUBLICATIONS

Amarasinghe, M. et al., "Obtaining Large Columnar CdTe Grains and Long Lifetime on Nanocrystalline CdSe, MgZnO, or CdS Layers," Advanced Energy Materials, vol. 8, 2018, 9 pages.

Batzill, M. et al., "The surface and materials science of tin oxide," Elsevier Progress in Surface Science, vol. 79, 2005, 108 pages.

Bittau, F. et al., "Analysis and optimisation of the glass/TCO/MZO stack for thin film CdTe solar cells," Solar Energy Materials and Solar Cells, vol. 187, 2018, 8 pages.

Colegrove, E. et al., "Colossal Grains for a New Structural Paradigm in Thin-Film Photovoltaics," ACCGE-22, 22nd American Conference on Crystal Growth and Epitaxy, and OMVPE-20, 20th Workshop on Organometallic Vapor Phase Epitaxy, 2021, 31 pages.

Cullis, A.G., "Fundamental Aspects of High Speed Crystal Growth From the Melt," Mat. Res. Soc. Symp. Proc., vol. 35, 1985, 10 pages.

Keene, B.J., "Review of data for the surface tension of pure metals," International Materials Reviews, vol. 38, No. 4, 1993, 36 pages.

Kim, K.H. et al., "Temperature-gradient annealing of CdZnTe under Te overpressure," Journal of Crystal Growth, vol. 354, 2012, 5 pages.

Major, J.D. et al., "In-depth analysis of chloride treatments for thin-film CdTe solar cells," Nature Communications, Oct. 2016, 10 pages.

Metzger, W.K. et al., "$CdCl_2$ treatment, S diffusion, and recombination in polycrystalline CdTe," Journal of Applied Physics, vol. 99, 2006, 6 pages.

Moseley, J. et al., "Impact of dopant-induced optoelectronic tails on open-circuit voltage in arsenic-doped Cd(Se)Te solar cells," Journal of Applied Physics, vol. 128, 2020, 17 pages.

Nagaoka, A. et al., "High p-type doping, mobility, and photocarrier lifetime in arsenic-doped CdTe single crystals," Applied Physics Letters, vol. 112, 2018, 4 pages.

PCT International Search Report and Written Opinion from corresponding PCT Patent Application No. PCT/US20/43731 dated Nov. 19, 2020, 7 pages total.

\* cited by examiner

EXTREME LARGE GRAIN (1 MM) LATERAL GROWTH OF CD(SE,TE) ALLOY THIN FILMS BY REACTIVE ANNEALS

CROSS-REFERENCE TO RELATED APPLICATIONS

This application is a national phase entry under 35 U.S.C. § 371 and claims priority to PCT application number PCT/US2020/043731 filed 27 Jul. 2020 which claims priority under 35 U.S.C. § 119 to U.S. provisional patent application No. 62/879,191 filed on 26 Jul. 2019, the contents of which are hereby incorporated in their entirety.

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

A desired result of many polycrystalline (pX) thin film growth processes is making films having large grain sizes. For example, in polycrystalline solar cell research (e.g. CdTe and $Cu(In,Ga)Se_2$), the use of rapid deposition techniques, lower temperatures, and non-ideal substrates (e.g. small-grained, amorphous films, glass) generally limit the grain size of 1-10 micron thick deposited films to only a few microns. As grain size decreases, the density of grain boundaries increase. For most applications, grain boundaries degrade performance. For semiconductor applications, grain boundaries represent defective areas where carriers recombine resulting in decreased carrier lifetime. For solar cells, lower carrier lifetimes reduce cell performance (for example, open-circuit voltage, $V_{oc}$, short-circuit current density, $J_{sc}$, and fill-factor, (FF)). Grain boundaries can also represent energetic barriers to carrier transport such that carrier mobility is decreased which has the effect of decreasing carrier diffusion length. This is particularly so if the device requires lateral transport (parallel to the substrate upon which the film is deposited).

Grain size in polycrystalline-thin films can be increased by annealing post-deposited films at temperatures equal to or greater than the temperature of the substrate upon which the films were originally deposited. For example, a 550° C. anneal of a CdTe film deposited at 400° C. will increase grain size. Densification or the elimination of pores within the films typically occurs with grain growth. The high surface energy of grain boundaries is the primary driving force for grain growth. As growth occurs and grain boundaries decrease, the total energy of the film is reduced. The rate or speed at which grain growth occurs is determined by the barriers to the atomistic diffusion required for grain growth. Where only solid-state diffusion processes exist, growth is slow at temperatures below which re-evaporation of CdTe would result in either surface coarsening or at higher temperatures, the complete elimination of the film. Under these conditions, the curvature of the grain boundary provides an internal "pressure" over which atoms from smaller-grains diffuse across grain boundaries into larger-grains. This growth of larger-grains at the expense of smaller-grains is known as recrystallization, or more formally Ostwald ripening. Since the internal "pressure" increases as the grain radius decreases, grain growth is faster if the starting film grain size is smaller.

SUMMARY

In an aspect, disclosed herein is a method for making at least one polycrystalline $CdSe_xTe_{1-x}$ alloy film, where $0 \le x \le 1$, comprising individual grains with lengths of up to about 1000 μm in at least one dimension. In an embodiment, the alloy film has a thickness of from about 0.5 to about 10 μm. In an embodiment, the method further comprises the step of depositing an interfacial layer upon a substrate wherein the surface energy of the interfacial layer is greater than the surface energy of the $CdSe_xTe_{1-x}$ alloy film, where $0 \le x \le 1$. In an embodiment, the surface energy of the interfacial layer is greater than 65 erg/cm² upon the substrate. In another embodiment, the surface energy of the interfacial layer is greater than 200 erg/cm² upon the substrate. In an embodiment, the interfacial layer comprises $Al_2O_3$, MgZnO, or $SnO_2$. In an embodiment, the interfacial layer has a thickness of from about 0.1 nm to about 100 nm. In an embodiment, the method further comprises depositing a polycrystalline film of $CdSe_xTe_{1-x}$ alloy, where $0 \le x \le 1$, onto the interfacial layer. In an embodiment, the alloy film composition is $CdSe_xTe_{1-x}$ where $0 \le x \le 0.1$. In an embodiment, the method further comprises annealing the polycrystalline $CdSe_xTe_{1-x}$ alloy film, where $0 \le x \le 1$, in an atmosphere comprising a material with a melting point of from about 220° C. to about 450° C., and a liquid phase surface energy of from about 115 erg/cm² to about 240 erg/cm² with the $CdSe_xTe_{1-x}$ alloy film, where $0 \le x \le 1$. In an embodiment, the atmosphere comprises an over-pressure of Se, Te, or a mixture of Se and Te such that Se, Te, or the Se and Te mixture diffuses into the polycrystalline film of $CdSe_xTe_{1-x}$ alloy film, where $0 \le x \le 1$, and reduces Se, Te, or the mixture of Se and Te loss during the annealing compared to the atmosphere without an over-pressure of Se, Te, or a mixture of Se and Te. In an embodiment, the annealing occurs in a blackbody environment between two graphite plates. In an embodiment, the material forms liquid phases with melting temperatures between about 220° C. to about 450° C. and surface energies of about 115 ergs/cm² to about 240 ergs/cm² with the $CdSe_xTe_{1-x}$ alloy film, where $0 \le x \le 0.4$. In an embodiment, the temperature of the polycrystalline film is higher than the temperature of the material. In an embodiment, the temperature of the polycrystalline film of $CdSe_xTe_{1-x}$ alloy, where $0 \le x \le 1$, is from about 500 to about 650° C. In an embodiment, the method further comprises the deposition of at least one CdTe layer onto the annealed polycrystalline film of $CdSe_xTe_{1-x}$ alloy, where $0 \le x \le 1$. In an embodiment, the median grain size of the annealed polycrystalline film of $CdSe_xTe_{1-x}$ alloy, where $0 \le x \le 1$, is greater than 500 μm in at least one dimension. In an embodiment, the median grain size of the annealed polycrystalline film of $CdSe_xTe_{1-x}$ alloy, where $0 \le x \le 1$, is greater than 100 μm in at least one dimension. In an embodiment, the median grain-size to thickness ratio of the film is greater than 100.

In an aspect, disclosed herein is a photovoltaic device comprising the polycrystalline alloy films made by any of the methods disclosed herein.

In an aspect, disclosed herein is a composition of matter comprising polycrystalline $CdSe_xTe_{1-x}$ alloy film, where $0 \le x \le 1$, comprising individual grains with lengths of up to about 1000 μm in at least one dimension.

In an aspect, disclosed is a method for making a CdTe solar cell comprising depositing CdTe layers onto the annealed polycrystalline film of CdTe or CdSe$_{0.10}$Te$_{0.9}$ alloy made from using methods for making polycrystalline CdTe and CdSe$_{0.10}$Te$_{0.9}$ alloy thin films having individual grain sizes of about 1000 μm. In an embodiment, the deposited polycrystalline film of CdTe or CdSe$_{0.10}$Te$_{0.9}$ alloy made from using the methods disclosed herein result in polycrystalline CdTe and CdSe$_{0.10}$Te$_{0.9}$ alloy thin films wherein the median grain size is greater than 500 microns.

In an aspect, disclosed herein are annealed polycrystalline films of CdTe or CdSe$_{0.10}$Te$_{0.9}$ alloy made from using the methods disclosed herein resulting in films where the grain-size to thickness ratio of the film is greater than 100.

In an aspect, disclosed herein is a photovoltaic device that includes the polycrystalline alloy thin films made by the methods disclosed herein.

Other objects, advantages, and novel features of the present invention will become apparent from the following detailed description of the invention when considered in conjunction with the accompanying drawings.

DESCRIPTION OF THE DRAWINGS

FIG. 1a depicts an as-deposited CdTe film (close-spaced sublimation) with an initial grain size of about 1 micron or less. FIG. 1B depicts CdCl$_2$ treated CdTe film with larger grain sizes of from about 2-10 microns and has a maximum grain-size/thickness ratio of about 3 to 4.

FIG. 2 depicts a schematic of an embodiment of an anneal process of CdTe or CdSe$_{0.10}$Te$_{0.9}$ alloy thin film in close proximity to a Se and or Te-containing material between two parallel graphite plates. The temperature of film/substrate and material is indicated as T$_{substrate}$ and T$_{material}$ respectively, system pressure P, and distance between film/substrate and material indicated as "X".

FIG. 3 depicts a low magnification scanning electron microscope (SEM) image of a tilted large-grain CdSe$_{0.10}$Te$_{0.9}$ alloy film showing both the edge and surface of the film. Grain sizes of the CdSe$_{0.10}$Te$_{0.9}$ alloy film are depicted relative to a 1 mm (1000 microns) scale-bar to show grains of approximately 0.5 mm=500 microns grain size. As depicted in FIG. 3, an inset shows a uniform film thickness of 5.8 microns corresponding to a grain-size/film thickness ratio of about 100. As depicted in another inset in FIG. 3, the EBSD confirms that individual grains are single crystal.

FIGS. 4a and 4b depict two possible grain morphologies for CdTe films deposited on large-grain CdSe$_{0.10}$Te$_{0.9}$ alloy films or "templates". FIG. 4a shows a large-grained CdTe film deposited epitaxially on a template. FIG. 4b shows a small-grained CdTe film deposited on a template.

DETAILED DESCRIPTION

Disclosed herein are methods for growing thin film compositions having grain sizes of up to about 1000 μm in at least one dimension. In an embodiment, the grain sizes are up to about 1000 μm as measured by the length, width or diameter of a grain. In an embodiment, polycrystalline CdSe$_x$Te$_{1-x}$ where 0≤x≤1, thin films grown using methods disclosed herein have a median grain size of about 500 μm. In an embodiment, polycrystalline CdSe$_x$Te$_{1-x}$ where 0≤x≤1, thin films grown using methods disclosed herein have a median grain size of about 100 μm. Because solid-state diffusion is limited in terms of speed as well as extent (limited diffusion distance for reasonable anneal times), additives are sometimes used to introduce liquid phases. In a broad sense, liquid phases present a much smaller barrier to atomistic diffusion than solid phases. A common method to promote liquid phase enhanced grain growth is through using additives that form eutectics with the primary phase. For example, a common additive to promote grain growth in pX-CdTe films is CdCl$_2$. CdCl$_2$ and CdTe have melting temperatures of 564 and 1092° C. respectively. However, where the local composition is approximately 4:1 CdCl$_2$ to CdTe (i.e., the "eutectic composition" at 80% CdCl$_2$) a liquid phase forms at approximately 490° C., considerably lower than the melting temperature of CdTe. The lower melting temperature combined with the higher energy and thus driving force of small-grained CdTe leads to a respectable degree of grain growth when CdTe is now heated to lower temperatures of 400-500° C. in the presence of CdCl$_2$.

In an embodiment, the thickness of the CdSe$_x$Te$_{1-x}$, where 0≤x≤1, films is from about 0.5 microns to about 10 microns. In another embodiment the thickness of the films are less than 0.5 microns.

In an embodiment, CdSe$_x$Te$_{1-x}$, where 0≤x≤1, is deposited on large-grain CdSe$_x$Te$_{1-x}$, where 0≤x≤1, templates epitaxially such that the resulting grain size of the CdSe$_x$Te$_{1-x}$, where 0≤x≤1, layer equals the grain size of the template. In an embodiment, methods disclosed herein are used to make 100 um to 1000 um CdSe$_x$Te$_{1-x}$, where 0≤x≤1, grains.

In an embodiment, CdSe$_x$Te$_{1-x}$, where 0≤x≤1, with a grain size of from about 1-10 um is deposited on the large grain template (about 1000 um) of CdSe$_x$Te$_{1-x}$, where 0≤x≤1.

In an embodiment, the alloy is CdSe$_x$Te$_{1-x}$, where 0≤x≤0.4. In an embodiment, the material is CdSe$_{0.4}$Te$_{0.6}$ and provides an over-pressure of a Se-containing material. In an embodiment, the material can just be CdTe (i.e., no Se) where Se is present in the film being annealed, but not in the annealing material.

Figure 1A:
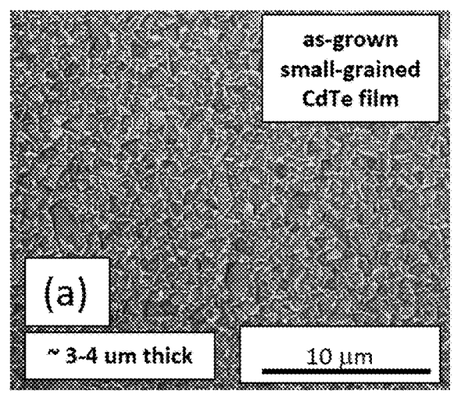
FIG. 1a and FIG. 1B depict the typical limit of CdTe grain growth using CdCl$_2$.

Though CdCl$_2$ treatments of CdTe films at temperatures near 500° C. can lead to considerable grain growth, there are problems associated with using CdCl$_2$. First, the use of high CdCl$_2$ anneal temperatures can be problematic in that the strain resulting from grain growth in the CdSe$_x$Te$_{1-x}$, where 0≤x≤1, can cause the CdSe$_x$Te$_{1-x}$, where 0≤x≤1, film to delaminate. Another issue with CdCl$_2$ is that it can be corrosive to metal layers (e.g., contacts) used in solar cells. Finally, the morphology of the larger-grained film created by using CdCl$_2$ is that the morphology of the grains may not be conducive to solar cells. FIG. 1, for example, depicts a typical film microstructure of a 3-4 μm thick CdTe film (deposited by close-spaced sublimation (CSS)) before and after a CdCl$_2$ treatment. As depicted in FIG. 1, a 5-10 fold increase in grain size is caused due to the CdCl$_2$ treatment. If the starting grain size is sub-micron size, the corresponding percent increase can be even larger. Though this appears beneficial, with grain growth there can be a tendency for considerable voiding between individual grains (grain boundaries) and at the intersection of three or more grains. Voids such as these are undesirable for photovoltaics. In an embodiment, an additional benefit to using the methods disclosed herein is that the use of CdCl$_2$ may be avoided and thus the corrosive effects of any chlorine gas upon any metal within any photovoltaic device made, is avoided. Diffusion from the subsequent metal layer at the back surface (i.e., the back contact) or from front-surface films (i.e., the front contact layers) readily occurs at such voids leading to electrical shunting across the thickness of the device and a considerable loss in performance. The reason for such voiding is again determined by surface energy. The spreading coefficient S(b/a) of a film "b" over a surface "a" is given by Equation (1)

Equation (1)

$$S(b/a) = \gamma_a - (\gamma_b + \gamma_{ab}) \quad (1)$$

Where $\gamma_a$ equals the surface energy of surface "a", $\gamma_b$ equals the surface energy of film "b", and $\gamma_{ab}$ is the interfacial energy between "a" and "b". The larger the value of S(b/a), the more film "b" spreads uniformly across the substrate surface "a" resulting in reduced voiding. Without being limited by theory, a major result of Equation (1) is that spreading occurs when: 1) the surface energy of the substrate surface is high, 2) when the surface energy of the film is low, and 3) when the surface energy of the interface between substrate and film is low. The net result is the overall surface energy of the substrate/film system is reduced. In an embodiment, the surface energy of the interfacial layer is greater than 65 erg/cm$^2$ upon a substrate. In another embodiment, the surface energy of the interfacial layer is greater than 200 erg/cm$^2$ upon a substrate.

Figure 1B:
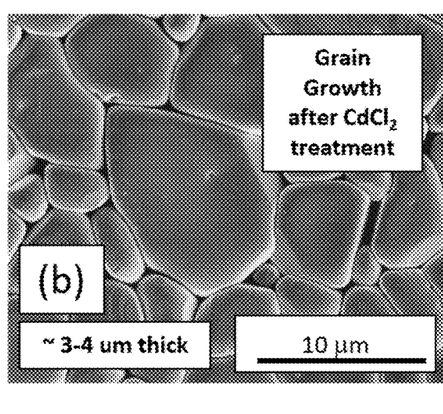

The grain growth depicted in FIG. 1B is based upon the formation of liquid phases by the formation of eutectics between CdCl$_2$ and CdTe. In this case, spreading is limited and thus, grain growth is limited. The largest grain sizes demonstrated with CdCl$_2$ up to the eutectic temperature of 490° C. is typically around 10 μm or less for 5-10 μm thick pX-CdTe films deposited on CdS, MgZnO, CdSe, and other materials used in making photovoltaic devices. The corresponding grain-size/thickness ratio observed using CdCl$_2$ in this method is typically not greater than 2-5.

If the CdCl$_2$ is replaced with a material in which the film is soluble at a lower melting temperature and if this liquid phase exhibits a high spreading coefficient relative to the underlying substrate surface, the solute-rich liquid disperses rapidly across the substrate surface. As the liquid evaporates it becomes supersaturated with the film material and begins to solidify. If the spreading is large before solidification, significant grain growth can result.

Selenium is one such material. Selenium has a relatively low surface energy at its melting point. Only rubidium and cesium have lower surface energies. In addition, selenium has one of the lower melting temperatures for solid elements at 221° C. Without being limited by theory, the corresponding eutectic temperature between Se and CdTe is unknown but should be lower than the Se melting temperature. With regards to CdTe pX thin films used in solar cells, unlike other elemental additives, selenium is known to be beneficial and increases the performance of CdTe devices in that it decreases the bandgap of the CdTe resulting in more photon absorption and thus higher $J_{sc}$.

Tellurium is another such material that has a relatively low surface energy at its melting point of 450° C. Similar effects pertain to the use of tellurium as described herein. In this embodiment, the annealing material supplies an overpressure of Te.

In an embodiment, when a CdSe$_x$Te$_{1-x}$, where 0≤x≤1, small-grained, pX thin film is deposited on a high surface energy substrate and subsequently annealed at substrate temperatures between 500-650° C. in an evacuated chamber containing a Se and or Te-ambient atmosphere, extremely large grains up to and exceeding 1 mm (1000 μm) result. The corresponding grain-size/thickness ratio of these films often exceeds 100. This is a significant improvement over the grain size and grain-size/thickness ratio of the thin films created using a CdCl$_2$ process, depicted, for example, in FIG. 1. Extremely large grain growth occurs when the annealed CdSe$_x$Te$_{1-x}$ has a composition of 0≤x≤0.1 and the ambient is established by an annealing powder with x having a composition of 0≤x≤0.4.

The grain sizes of about 1 mm while having grain-size/thickness ratio of about 100 made by using methods disclosed herein far exceeds the average of the largest previously reported grain sizes of up to about 14 μm while having a grain-size/thickness ratio of up to about 2-5.

Figure 2:
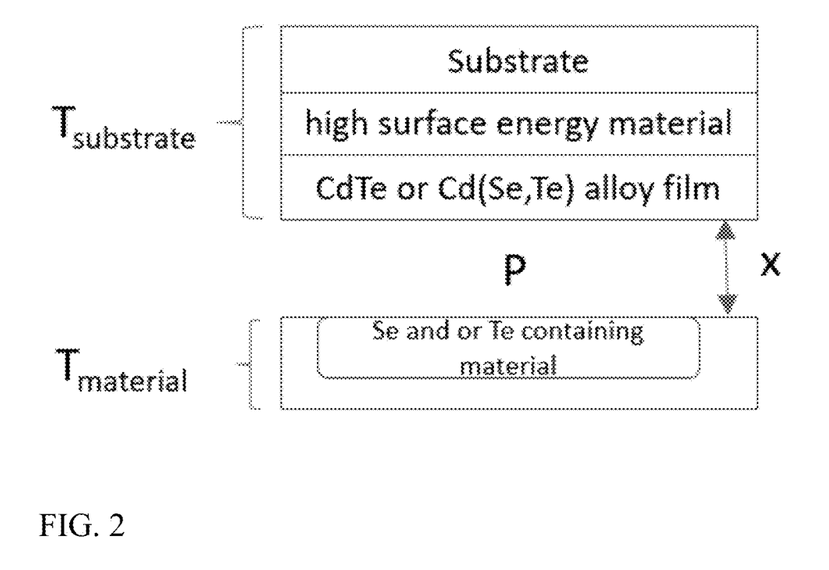

Using methods disclosed herein, the resulting very large-grains from the Se and or Te-anneal were confirmed to be single-crystal by electron back scatter diffraction (EBSD), exhibit extremely flat and smooth surfaces over the area of the grain, and have well-formed grain boundaries with no voiding or pinholes. By using methods disclosed herein, the Se and or Te-ambient provides an overpressure of Se and or Te over the film surface which both increases the in-diffusion of Se and or Te into the film as well as minimizes the loss of Se and or Te contained in CdSe$_x$Te$_{1-x}$, where 0≤x≤1, alloy films. The Se-ambient can be realized by any means which provides a Se overpressure. For example, one embodiment is to use a solid source containing Se. In an embodiment, and as depicted in FIG. 2, a Se-containing powder, for example CdSe$_x$Te$_{1-x}$ (where x is nominally 0.0 to 0.4) is placed in a graphite pocket hearth directly below a CdTe or CdSe$_x$Te$_{1-x}$, where 0≤x≤1, alloy film that was previously deposited onto a high surface energy material. The temperature of the Se-containing material ($T_{material}$), distance between the material and film/substrate (x), system pressure (P) and temperature of the film/substrate ($T_{substrate}$) determines the overall balance of Se diffused into the CdTe or Cd(Se,Te) alloy film and Se loss from the film. In an embodiment, these parameters are adjusted so as the net flow of selenium is into the film resulting in the formation of low temperature, low surface energy liquid phases in which the CdSe$_x$Te$_{1-x}$, where 0≤x≤1, alloy films are soluble.

Figure 3:
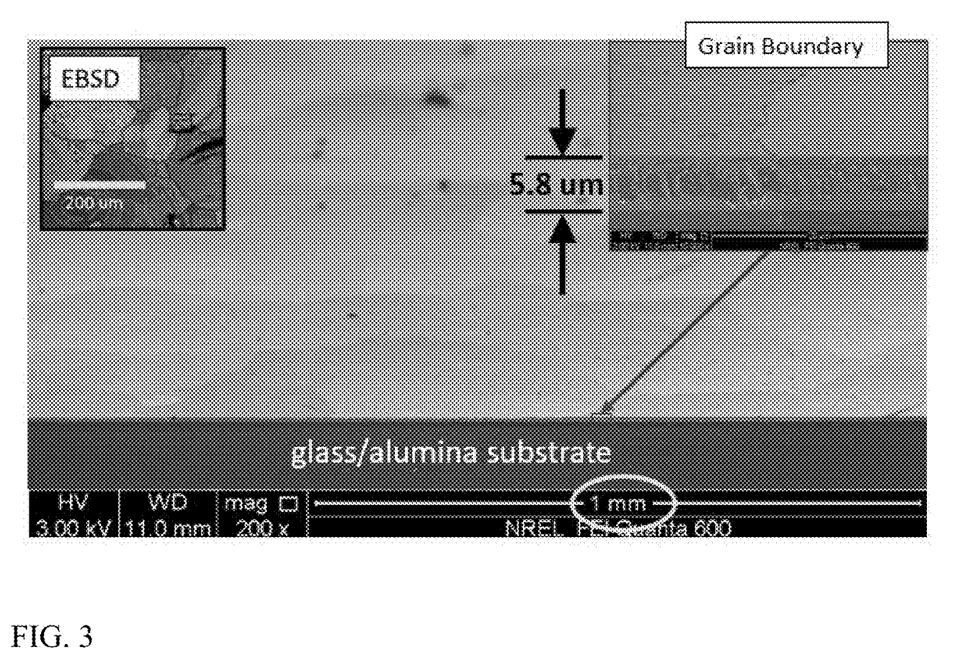

An example of the resulting increased grain size in a CdSe$_x$Te$_{1-x}$, where 0≤x≤1, film is depicted in FIG. 3. As depicted in FIG. 3, by using methods disclosed herein for making polycrystalline CdSe$_x$Te$_{1-x}$, where 0≤x≤1, thin films, the grain sizes were up to 1 mm with many grains sizes being in the range of 100-500 As depicted in FIG. 3, the film thickness across the entire sample was measured to be 5.8 μm with a Dektak surface profiler and the surface roughness was less than 10 nm. Grain boundaries were well formed with no voiding either between grains or at points where three or more grains intersected. As depicted in FIG. 3, EBSD confirmed the single-crystal nature of individual grains as well as a strong <111> texture with random orientation in the substrate plane.

In an embodiment, polycrystalline CdSe$_x$Te$_{1-x}$, where 0≤x≤1, thin films grown using methods disclosed herein are made by first depositing a very thin (100 nm) high surface energy material onto a substrate. In an embodiment, the very thin high surface energy material has a thickness from about 0.1 to about 100 nm. In an embodiment, the very thin high surface energy material is an interfacial layer. For a CdTe solar cell, the substrate typically consists of a glass/transparent conducting oxide or a glass/transparent-conducting-oxide+buffer where the buffer is a n-type material like CdS or Mg(Zn,O). In an embodiment, this is the substrate.

In an embodiment, the second step for growing polycrystalline CdSe$_x$Te$_{1-x}$, where 0≤x≤1, thin films as disclosed herein is to deposit a thin, small-grained, pX CdSe$_x$Te$_{1-x}$, where 0≤x≤1, film (nominally about 1-5 μm thick) onto the high surface energy material coated substrate. In an embodiment, the alloy composition is CdSe$_{0.10}$Te$_{0.9}$. This film can be deposited by evaporation or sputtering onto either an unheated or low-temperature heated (T≤450° C.) substrate.

In an embodiment, the third step for growing polycrystalline CdSe$_x$Te$_{1-x}$, where 0≤x≤1, thin films as disclosed herein is to anneal the [CdSe$_x$Te$_{1-x}$, where 0≤x≤1, or CdSe$_{0.10}$Te$_{0.9}$ alloy]/substrate with the CdSe$_x$Te$_{1-x}$, where 0≤x≤1, or CdSe$_{0.10}$Te$_{0.9}$ alloy film face down towards a CdSe$_{0.4}$Te$_{0.6}$ powder contained in a graphite hearth in an evacuated ambient that is then subsequently backfilled with an inert gas to a pressure, P. In an embodiment, the powder is CdTe and selenium is present in the film being annealed. In an embodiment, the powder, or material, is at about 220° C. to about 450° C., and has a liquid phase surface energy of from about 115 erg/cm' to about 240 erg/cm' The film/ substrate should be slightly hotter than the powder to prevent excessive condensation of the powder onto the film. In an embodiment, the film/substrate is at from about 500 to 650° C. and the powder is from about 490 to 640° C. Next, the distance (x) between the powder and film/substrate is adjusted so as to balance Se flow into the film/substrate during grain growth, see FIG. 2. In an embodiment, the anneal time is about 15 min but can be varied in order to balance Se flow into the film/substrate. In an embodiment, the inert gas used is helium, but other inert gases can be used such that the balance of Se flow into the film/substrate is maintained. In an embodiment, pressures of about 100 Torr are used within the hearth or other reaction chamber, but other pressures can be used as long as the balance of Se flow into the film/substrate is maintained. In the last step, the film/substrate is cooled to allow the out-diffusion of excess Se.

Figure 4A:
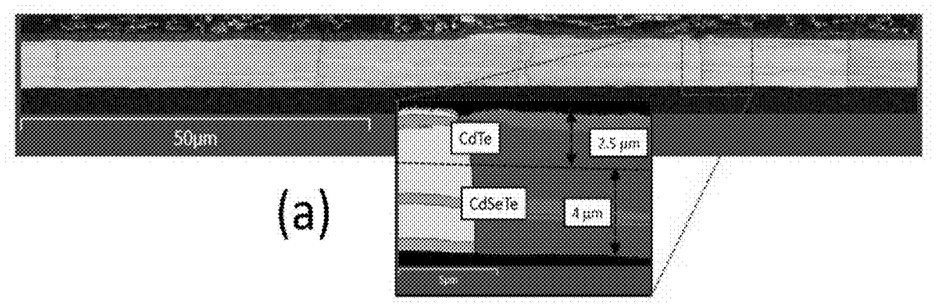
Figure 4B:
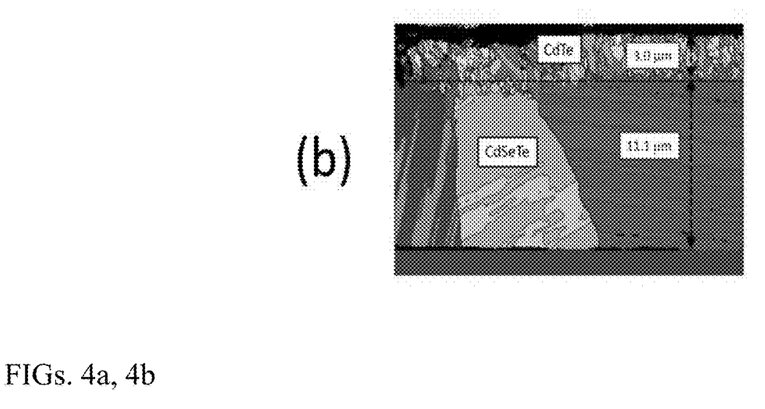

In an embodiment the resulting large-grained film can be used as a "template" upon which to subsequently deposit CdSe$_x$Te$_{1-x}$, where 0≤x≤1, either epitaxially, or as small-grained films. When growth conditions permit and epitaxy is present, the deposited CdSe$_x$Te$_{1-x}$, where 0≤x≤1, achieves the same grain size as the template thus providing a method by which to grow very large CdSe$_x$Te$_{1-x}$, where 0≤x≤1, grains (up to the grain size present in the template). FIG. 4A shows the overall film grain size of a 2.5 micron/4 micron thick CdTe/CdSeTe structure with a 50 micron scale-bar and FIG. 4B shows an EBSD image confirming the epitaxial growth of CdTe. In this embodiment, the grain-size/thickness ratio of the CdTe is approximately 20. Similarly, when growth conditions do not favor epitaxy, a more conventional, smaller-grained CdTe film results as shown in FIG. 4B where a 3.0 micron/11.1 micron thick CdTe/CdSeTe EBSD image confirms the smaller grain size of the CdTe layer. Subsequent processing of dense, epitaxially deposited CdTe films require higher anneal temperatures and longer anneal times due to processes being bulk-diffusion limited. Subsequent processing of more conventional, smaller-grained CdTe films remain grain-boundary diffusion limited to support more conventional (lower) temperatures and (shorter) anneal times. Large-grained films can be used as templates for depositing either epitaxial (large-grain) CdTe or small-grain CdTe films.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A method for making at least one polycrystalline CdSe$_x$Te$_{1-x}$ alloy film, comprising growing at least one CdSe$_x$Te$_{1-x}$ alloy film by liquid phase enhanced grain growth, wherein:
   0≤x≤1,
   the CdSe$_x$Te$_{1-x}$ alloy film comprises individual grains of about 100 um to about 1000 um in length and/or width, and
   a median grain-size to thickness ratio of the film is greater than 10.

2. The method of claim 1 wherein the alloy film has a thickness of from about 0.5 to about 10 μm.

3. The method of claim 1 further comprising the step of depositing an interfacial layer upon a substrate wherein the surface energy of the interfacial layer is greater than the surface energy of the CdSe$_x$Te$_{1-x}$ alloy film, where 0≤x≤1.

4. The method of claim 3 wherein the surface energy of the interfacial layer is greater than 65 erg/cm$^2$ upon the substrate.

5. The method of claim 3 wherein the surface energy of the interfacial layer is greater than 200 erg/cm$^2$ upon the substrate.

6. The method of claim 3 wherein the interfacial layer comprises Al$_2$O$_3$, MgZnO, or SnO$_2$.

7. The method of claim 3 wherein the interfacial layer has a thickness of from about 0.1 nm to about 100 nm.

8. The method of claim 3 further comprising depositing a polycrystalline film of CdSe$_x$Te$_{1-x}$ alloy, where 0≤x≤1, onto the interfacial layer.

9. The method of claim 8 wherein the alloy film composition is CdSe$_x$Te$_{1-x}$ where 0≤x≤0.1.

10. The method of claim 3 further comprising annealing the polycrystalline CdSe$_x$Te$_{1-x}$ alloy film, where 0≤x≤1, in an atmosphere comprising a material with a melting point of from about 220° C. to about 450° C., and a liquid phase surface energy of from about 115 erg/cm$^2$ to about 240 erg/cm$^2$ with the CdSe$_x$Te$_{1-x}$ alloy film, where 0≤x≤1.

11. The method of claim 10 wherein the atmosphere comprises an over-pressure of Se, Te, or a mixture of Se and Te such that Se, Te, or the Se and Te mixture diffuses into the polycrystalline film of CdSe$_x$Te$_{1-x}$ alloy film, where 0≤x≤1, and reduces Se, Te, or the mixture of Se and Te loss during the annealing compared to the atmosphere without an over-pressure of Se, Te, or a mixture of Se and Te.

12. The method of claim 10 wherein the annealing occurs in a blackbody environment between two graphite plates.

13. The method of claim 10 wherein the material forms liquid phases with melting temperatures between about 220° C. to about 450° C. and surface energies of about 115 ergs/cm$^2$ to about 240 ergs/cm$^2$ with the CdSe$_x$Te$_{1-x}$ alloy film, where 0≤x≤0.4.

14. The method of claim 10 wherein the temperature of the polycrystalline film is higher than the temperature of the material.

15. The method of claim 14 wherein the temperature of the polycrystalline film of $CdSe_xTe_{1-x}$ alloy, where $0 \leq x \leq 1$, is from about 500 to about 650° C.

16. The method of claim 14 further comprising the deposition of at least one CdTe layer onto the annealed polycrystalline film of $CdSe_xTe_{1-x}$ alloy, where $0 \leq x \leq 1$.

17. The method of claim 14 wherein the median grain size of the annealed polycrystalline film of $CdSe_xTe_{1-x}$ alloy, where $0 \leq x \leq 1$, is greater than 500 μm in length or width.

18. The method of claim 14 wherein the median grain-size to thickness ratio of the film is greater than 100.

19. A photovoltaic device comprising a polycrystalline alloy film made by the method of claim 1.

20. A polycrystalline $CdSe_xTe_{1-x}$ alloy film, where $0 \leq x \leq 1$, comprising individual grains of about 100 μm to about 1000 μm in length or width.

\* \* \* \* \*